(12) United States Patent
Yang et al.

(10) Patent No.: US 6,861,761 B2
(45) Date of Patent: Mar. 1, 2005

(54) MULTI-CHIP STACK FLIP-CHIP PACKAGE

(75) Inventors: Chaur-Chin Yang, Tainan (TW); Sung-Fei Wang, Kaohsiung (TW)

(73) Assignee: Advanced Semiconductor Engineering Inc., Kaoshiung (TW)

( * ) Notice: Subject to any disclaimer, the term of this patent is extended or adjusted under 35 U.S.C. 154(b) by 0 days.

(21) Appl. No.: 10/697,111

(22) Filed: Oct. 31, 2003

(65) Prior Publication Data

US 2004/0124539 A1 Jul. 1, 2004

(30) Foreign Application Priority Data

Dec. 31, 2002 (TW) ........................................ 91221786 U

(51) Int. Cl.⁷ .............................................. H01L 29/34
(52) U.S. Cl. ..................... 257/777; 257/778; 257/737; 257/738; 438/108
(58) Field of Search ................................ 257/777, 778, 257/737, 738; 438/108

(56) References Cited

U.S. PATENT DOCUMENTS

| | | | |
|---|---|---|---|
| 5,616,520 A | * | 4/1997 | Nishiuma et al. ........... 438/125 |
| 5,923,090 A | | 7/1999 | Fallon et al. ............... 257/777 |
| 6,175,157 B1 | * | 1/2001 | Morifuji ..................... 257/777 |
| 6,414,384 B1 | * | 7/2002 | Lo et al. ..................... 257/685 |
| 6,462,420 B2 | * | 10/2002 | Hikita et al. ................ 257/777 |
| 6,503,776 B2 | * | 1/2003 | Pai et al. .................... 438/106 |
| 6,507,098 B1 | | 1/2003 | Lo et al. ..................... 257/686 |

* cited by examiner

*Primary Examiner*—Jasmine Clark
(74) *Attorney, Agent, or Firm*—Troxell Law Office, PLLC

(57) ABSTRACT

A multi-chip stack flip-chip package comprises a substrate and a chip assembly on the substrate. The chip assembly includes a dummy chip and a flip chip. The dummy chip has a redistribution layer that has a plurality of bump pads for mounting the flip chip, a plurality of peripheral pads for electrically connecting to the substrate, and a plurality of integrated circuit traces connecting the bump pads with the peripheral pads. The dummy chip is disposed between the flip chip and the substrate as an electrically connecting interface between the flip chip and the substrate for multi-chip flip-chip stack and fine pitch flip-chip mounting.

17 Claims, 2 Drawing Sheets

MULTI-CHIP STACK FLIP-CHIP PACKAGE

FIELD OF THE INVENTION

The present invention is generally relating to a multi-chip package (MCP), particularly to a multi-chip stack flip-chip package.

BACKGROUND OF THE INVENTION

It is well known that a multi-chip flip-chip package includes a plurality of flip chips with the bumps and a substrate for directly flip-chip mounting. In U.S. Pat. No. 6,507,098, Lo et al. disclosed a structure of a multi-chip stack package, which comprises a plurality of flip chips mounted on one surface of substrate. Each flip chip has a plurality of bumps on an active surface thereof for flip-chip (C4) mounting on the same surface of the substrate. The substrate is demanded to supply a large enough area for mounting the flip chips. However, the multi-chip flip-chip package can't achieve a vertical stack with the plurality of the flip chips. In addition, the substrate is a well-known printed circuit board (PCB), the minimum pitch of bump pads of the PCB substrate is about 200 μm (micrometer) according to current PCB technology, it is difficult to manufacture the substrate with pitch of bump pads less than 150 μm by means of PCB process. However the wiring pitch of the integrated circuits of the flip chip has reached 0.1 μm up-to-now which means that the chip size becomes smaller and smaller, and the bumps on the flip chip are more crowded. Normally the pitch of bumps of the flip chip is around 150 μm, even near to 70~90 μm for special design, so the pitch of bumps of the flip chip and the pitch of bump pads of the PCB become unmatchable. Therefore, the yield of mass production of multi-chip flip-chip package cannot reach the acceptable range because it is not easy to make a substrate with bump pads in tiny pitch.

In U.S. Pat. No. 5,923,090, Fallon et al. also disclosed another well-known stacked multi-chip package. The package comprises an integrated circuit chip by wire bonding and a flip chip. The integrated circuit chip is attached to a substrate, and the flip chip is mounted on a major surface of the integrated circuit chip. The integrated circuit chip has an extra circuitry (C4 connection pad) on the major surface different from a normal chip in order to bond the flip chip. Pads on periphery of the major surface of the integrated circuit chip are connected with the substrate by bonding wires. It is necessary that size of the integrated circuit chip is larger than that of the flip chip. But it is very hard to design the C4 connection pads, bond pads and extra circuitry on the major surface of the integrated circuit chip.

SUMMARY

It is a first object of the present invention to provide a multi-chip stack flip-chip package including a dummy chip attached to a first flip chip on a substrate. The dummy chip has a redistribution layer (RDL) without active electrical function. A second flip chip is mounted on the dummy chip. The redistribution layer of the dummy chip electrically connects the second flip chip with the substrate skipping over the first flip chip to assemble a multi-chip package enabling the plurality of flip chips to be stacked repeatedly.

It is a second object of the present invention to provide a multi-chip stack flip-chip package including a dummy chip. The dummy chip has a redistribution layer (RDL) without active electrical function and a flip chip is mounted on the dummy chip. The dummy chip with the redistribution layer is an electrically connecting interface to connect the flip chip to a PCB substrate, and the dummy chip is attached to back surface of another flip chip or PCB substrate for flip chip stacking.

In accordance with the present invention, a multi-chip stack flip-chip package comprises a substrate having a top surface and a bottom surface, such as printed circuit board (PCB). At least a first flip chip is disposed on the top surface of the substrate. A dummy chip is attached to back surface of the first flip chip and has a redistribution layer for electrically connecting to at least a second flip chip. The redistribution layer on a surface of the dummy chip includes a plurality of bump pads, a plurality of peripheral pads and a plurality of integrated circuit traces connecting the bump pads and the peripheral pads. The peripheral pads are arranged on periphery of upper surface of the dummy chip. The second flip chip is mounted on the dummy chip and connected with the bump pads of the redistribution layer by bumps. Further the peripheral pads of the redistribution layer are electrically connected with the substrate by electrically connecting devices, such as bonding wires or TAB leads, in order to vertically stack the plurality of flip chips.

DETAILED DESCRIPTION OF THE PRESENT INVENTION

Figure 1:
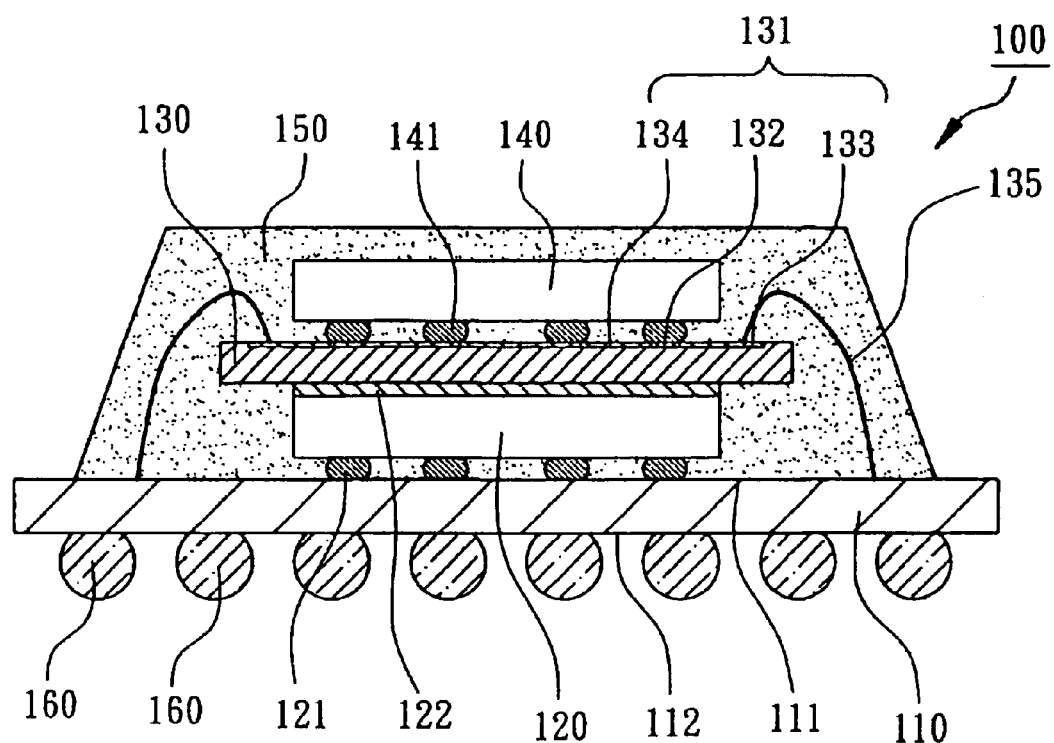
FIG. 1 is a cross-sectional view of the first embodiment of a multi-chip stack flip-chip package in accordance with the present invention.

Referring to FIG. 1, a multi-chip stack flip-chip package 100 in accordance with the first embodiment of the present invention comprises a substrate 110, at least a first flip chip 120, a dummy chip 130 and at least a second flip chip 140. The substrate 110 is a printed circuit board (PCB) formed by metal foil and glass fiber reinforced resin including BT resin, FR-4 resin or FR-5 resin. The substrate 110 has a top surface 111 and a bottom surface 112.

The first flip chip 120 is a chip with active electrical function, such as micro processor, micro controller, memory or Application Specific Integrated Circuit (ASIC). The first flip chip 120 has an active surface and a corresponding back surface. The first flip chip 120 includes a plurality of bumps 121 on its active surface. The first flip chip 120 is disposed on the top surface 111 of the substrate 110 by flip-chip mounting. Alternatively, the first flip chip 120 can be mounted on another dummy chip or a wire-bonding chip on the substrate 110 (not shown in the figure).

Figure 2:
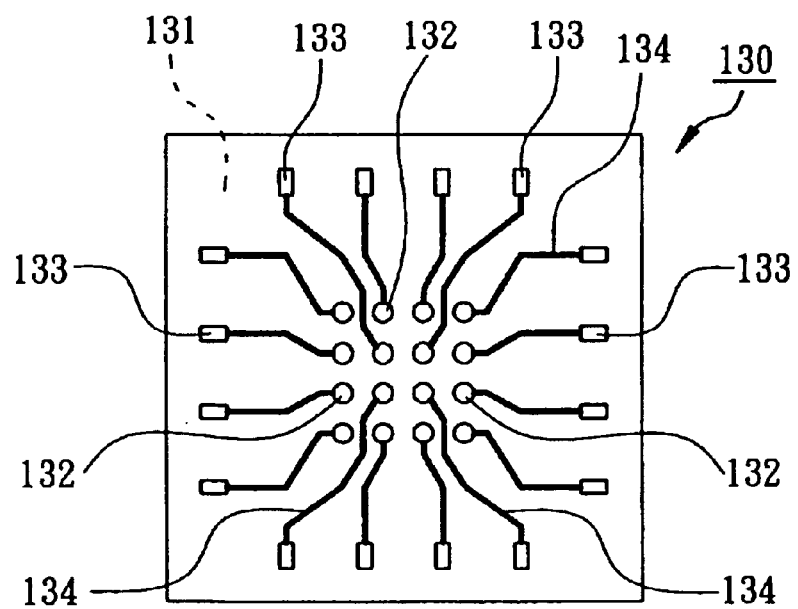
FIG. 2 is a top view of the first embodiment of the multi-chip stack flip-chip package in accordance with the present invention.

Normally the second flip chip 140 has a plurality of bumps 141 on its active surface and can be mounted on the dummy chip 130 to be a chip assembly in advance. The dummy chip 130 is attached to back surface of the first flip chip 120 by an adhesive layer 122. Preferably, the dummy chip 130 is larger than the first flip chip 120 in size. The dummy chip 130 is a silicon substrate without active electrical function but has a redistribution layer 131 (RDL) formed by integrated circuit manufacturing process. Referring to FIGS. 1 and 2, the redistribution layer 131 includes a plurality of bump pads 132, a plurality of peripheral pads 133 and a plurality of integrated circuit traces 134 connecting the bump pads 132 and the peripheral pads 133. The peripheral pads 133 are arranged on periphery of upper surface of the dummy chip 130, and the bump pads 132 are corresponding to the bumps 141 of the second flip chip 140 in array or the other. Preferably the bump pads 132 have a pitch smaller than that of the peripheral pads 133 to fully match pitch of the bumps 141 of the second flip chip 140. The bump pads 132, the peripheral pads 133 and the integrated circuit traces 134 of the redistribution layer 131 are formed on upper surface of the dummy chip 130 by integrated circuit manufacturing process. For example, a metal layer is sputtered on the upper surface of the dummy chip 130. After forming a photoresist, exposing the photoresist and etching the metal layer, then the redistribution layer 131 is formed. Preferably, a passivation layer is coated on the redistribution layer 131 to cover the integrated circuit traces 134 (not shown in the figure). The bumps 141 of the second flip chip 140 are bonded on the bump pads 132 of the redistribution layer 131.

After attaching the dummy chip 130 on the first flip chip 120, the peripheral pads 133 are electrically connected to the substrate 110 by a plurality of electrically connecting devices 135, such as bonding wires or TAB leads. The redistribution layer 131 of the dummy chip 130 enables the pitch of the bump pads 132 (<150 μm) to be much smaller than that of connecting point of substrate 110. In addition, an insulation compound 150 is formed on the top surface 111 of the surface 110 to protect the first flip chip 120, the second flip chip 140, the dummy chip 130 and the electrical connecting devices 135 by molding. The solder balls 160 are bonded on the bottom surface 112 of the substrate 110 for being outer terminals of the package 100. The dummy chip 130 is an electrically connecting interface for connecting the second flip chip 140 stacked on the flip chip 120 with the substrate 110. Thus the multi-chip flip-chip package 100 can repeatedly stack the plurality of flip chips 120,140 without increasing the size of the substrate 110. Moreover, the bump pads 132 of the dummy chip 130 can fully match bumps 141 of the second flip chip 140 in fine pitch to achieve a complete flip chip stacking under same advanced IC technology. The dummy chip 130 is larger than the second flip chip 140 in size so that the electrically connecting devices 135 may connect the peripheral pads 133 of the dummy chip 130 to the substrate 110. In this present invention, the size of the second flip chip 140 is not limited, may be larger, smaller or equal to the first flip chip 120. Furthermore, another dummy chip mounting with flip chip(s) (not shown in the drawing) is able to stack on the second flip chip 140 and is sealed inside the single insulation compound 150 to assemble a multi-chip stack flip-chip package, so the multi-chip stack flip-chip package 100 of the present invention is suitable for the plurality of flip chips in vertical stack configuration.

Figure 3:
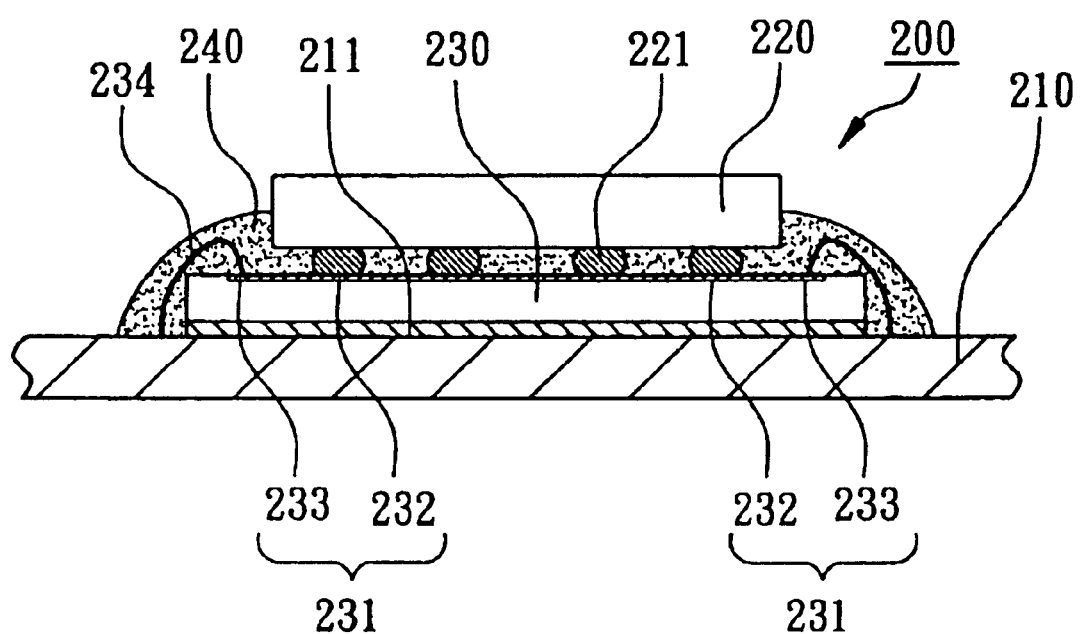
FIG. 3 is a cross-sectional view of the second embodiment of the multi-chip stack flip-chip package in accordance with the present invention.

Referring to FIG. 3, a multi-chip stack flip-chip package 200 in accordance with the second embodiment of the present invention comprises a substrate 210, at least a flip chip 220 and a dummy chip 230. The substrate 210 is a printed circuit board, such as BGA substrate, motherboard or memory module substrate. The substrate 210 has a top surface 211. The dummy chip 230 has a redistribution layer 231 formed by integrated circuit manufacturing process, and the redistribution layer 231 includes a plurality of bump pads 232, a plurality of peripheral pads 233 and a plurality of integrated circuit traces connecting the bump pads 232 with the peripheral pads 233. The peripheral pads 233 are arranged on the periphery of upper surface of the dummy chip 230 for electrically connecting to the substrate 210. The flip chip 220 is mounted on upper surface of the dummy chip 230 so that the bumps 221 of the flip chip 220 are bonded onto the bump pads 232 of the redistribution layer 213. Preferably the flip chip 220 is mounted on the dummy chip 230 in wafer form to manufacture a chip assembly in advance. The dummy chip 230 is attached to the top surface 211 by epoxy adhesive or PI adhesive film. The dummy chip 230 is configured to be an electrically connecting interface between the flip chip 220 and the substrate 210 to achieve fine pitch flip-chip mounting. Electrically connecting devices 234 connect the peripheral pads 233 of the dummy chip 230 to the substrate 210 so as to electrically connect the flip chip 220 with the substrate 210 through the dummy chip 230. An insulation compound 240 is formed on the substrate 210 by coating or dispensing to protect the flip chip 220 and the electrically connecting devices 234.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A multi-chip stack flip-chip package comprising:

a substrate having a top surface and a bottom surface;

at least a first flip chip disposed on the top surface of the substrate;

a dummy chip having a redistribution layer (RDL) and attached to the first flip chip;

at least a second flip chip mounted on the dummy chip and electrically connected to the redistribution layer; and a plurality of electrically connecting devices connecting the dummy chip with the substrate.

2. The multi-chip stack flip-chip package as claimed in claim 1, wherein the substrate is a printed circuit board.

3. The multi-chip stack flip-chip package as claimed in claim 1, wherein the dummy chip is larger than the second flip chip in size.

4. The multi-chip stack flip-chip package as claimed in claim 1, wherein the redistribution layer of the dummy chip has a plurality of bump pads, peripheral pads and integrated circuit traces connecting the bump pads with the peripheral pads.

5. The multi-chip stack flip-chip package as claimed in claim 4, wherein the bump pads have a pitch smaller than that of the peripheral pads.

6. The multi-chip stack flip-chip package as claimed in claim 5, wherein the pitch of the bump pads is below 150 μm.

7. The multi-chip stack flip-chip package as claimed in claim 1, wherein the electrically connecting devices are bonding wires.

8. The multi-chip stack flip-chip package as claimed in claim 1, further comprising another dummy chip on the top surface of the substrate for mounting the first flip chip.

9. The multi-chip stack flip-chip package as claimed in claim 1, wherein the first flip chip is mounted on the top surface of the substrate.

10. The multi-chip stack flip-chip package as claimed in claim 1, further comprising a plurality of solder balls bonded on the bottom surface of the substrate.

11. The multi-chip stack flip-chip package as claimed in claim 1, further comprising an insulation compound formed on the top surface of the substrate.

12. A multi-chip stack flip-chip package comprising:
   a substrate having a top surface and a bottom surface;
   a chip assembly disposed on the top surface of the substrate; and
   a plurality of electrically connecting devices connecting the chip assembly with the substrate;
   wherein the chip assembly comprises:
   a dummy chip having a redistribution layer (RDL); and
   at least a flip chip mounted on the dummy chip and electrically connected to the redistribution layer.

13. The multi-chip stack flip-chip package as claimed in claim 12, wherein the substrate is a printed circuit board.

14. The multi-chip stack flip-chip package as claimed in claim 12, wherein the redistribution layer of the dummy chip has a plurality of bump pads, peripheral pads and integrated circuit traces connecting the bump pads with the peripheral pads.

15. The multi-chip stack flip-chip package as claimed in claim 14, wherein the bump pads have a pitch below 150 $\mu$m.

16. The multi-chip stack flip-chip package as claimed in claim 12, wherein the dummy chip is larger than the flip chip in size.

17. The multi-chip stack flip-chip package as claimed in claim 12, further comprising an insulation compound formed on the top surface of the substrate.

* * * * *